United States Patent
Obuchi et al.

(10) Patent No.: US 7,533,306 B2
(45) Date of Patent: May 12, 2009

(54) TURBO DECODING APPARATUS AND INTERLEAVE-DEINTERLEAVE APPARATUS

(75) Inventors: Kazuhisa Obuchi, Kawasaki (JP); Tetsuya Yano, Kawasaki (JP); Kazuo Kawabata, Kawasaki (JP); Takaharu Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 344 days.

(21) Appl. No.: 11/296,678

(22) Filed: Dec. 7, 2005

(65) Prior Publication Data

US 2006/0107163 A1 May 18, 2006

Related U.S. Application Data

(60) Continuation of application No. 10/352,515, filed on Jan. 28, 2003, now Pat. No. 6,993,699, which is a division of application No. 09/823,564, filed on Mar. 30, 2001, now Pat. No. 6,547,766, which is a continuation of application No. PCT/JP99/00934, filed on Feb. 26, 1999.

(51) Int. Cl.
*H03M 13/27* (2006.01)
(52) U.S. Cl. .................................... 714/701
(58) Field of Classification Search ............... 714/701, 714/702, 755
See application file for complete search history.

(56) References Cited

U.S. PATENT DOCUMENTS

| | | | |
|---|---|---|---|
| 4,394,642 A | 7/1983 | Currie et al. | |
| 4,742,517 A | 5/1988 | Takagi et al. | |
| 4,821,254 A * | 4/1989 | Satoh et al. | 369/53.36 |
| 5,446,747 A | 8/1995 | Berrou | |
| 5,592,492 A * | 1/1997 | Ben-Efraim et al. | 714/702 |
| 5,737,252 A | 4/1998 | Hollmann et al. | |
| 5,745,497 A | 4/1998 | Ben-Efraim et al. | |
| 5,912,898 A | 6/1999 | Khoury | |
| 6,023,783 A | 2/2000 | Divsalar et al. | |
| 6,065,147 A | 5/2000 | Pyndiah et al. | |
| 6,119,264 A | 9/2000 | Berrou et al. | |
| 6,122,763 A | 9/2000 | Pyndiah et al. | |
| 6,182,261 B1 | 1/2001 | Haller et al. | |
| 6,292,918 B1 | 9/2001 | Sindhushayana et al. | |
| 6,304,991 B1 | 10/2001 | Rowitch et al. | |

(Continued)

FOREIGN PATENT DOCUMENTS

JP 61-260468 11/1986

(Continued)

OTHER PUBLICATIONS

European Search Report dated Feb. 28, 2006.

(Continued)

*Primary Examiner*—Stephen M Baker
(74) *Attorney, Agent, or Firm*—Katten Muchin Rosenman LLP

(57) ABSTRACT

In an apparatus such as a turbo decoding apparatus in which it is necessary to carry out interleave operation and deinterleave operation, there are provided a memory unit (5) and a memory control unit (12) capable of changing data writing order and data reading order with respect to the memory unit (5) depending on whether data is to be interleaved or deinterleaved. With this arrangement, the single unit of memory (5) can function as an interleaver and a deinterleaver, thereby reducing the size and cost the device.

3 Claims, 10 Drawing Sheets

U.S. PATENT DOCUMENTS

| | | | |
|---|---|---|---|
| 6,353,900 B1 * | 3/2002 | Sindhushayana et al. | .... 714/701 |
| 6,574,766 B2 | 6/2003 | Obuchi et al. | |
| 6,598,204 B1 | 7/2003 | Giese et al. | |

FOREIGN PATENT DOCUMENTS

| | | |
|---|---|---|
| JP | 7-254862 | 3/1995 |
| JP | 9-511606 | 11/1997 |

OTHER PUBLICATIONS

"Iterative Decoding of Parallel Concatenated Convolutional Codes" Small World Communications, Version 1.4, Jan. 13, 1999, pp. 1-12, XP002922269.

Z. Blazek et al. A DSP-Based Implementation of a Turbo-Decoder. IEEE Globecom, vol. 5, 1998, pp. 2751-2755, XP000801545.

Notice of Ground of Rejection mailed Jun. 26, 2007, from the corresponding Japanese Application.

Iterative Decoding of Parallel Concatenated Convolutional Codes. Jan. 13, 1999 Small World Communications pp. 1-12.

Adde et al. Performance and Complexity of Block Turbo Decoder Circuits. 1996 ICECS pp. 172-175.

Calzolari, et al. CCSDS Telemetry Channel Coding: The Turbo Coding Option. CCSDS Workshop, 1998 pp. 5/1-5/6.

Goalic, et al. Real-Time Turbo-Decoding of Product Codes on a Digital Signal Processor. Globecomm 1997 pp. 624-628.

Blazek, et al. "A DSP-Based Implementation of a Turbo-Decoder" IEEE Globecom 1998; pp. 2751-2755.

European Search Report dated Apr. 29, 2005.

Interactive Decoding of Parallel Concatenated Convolutional Cosed, pp. 1-12, Version 1.4 Small World Communications, Australia, Jan. 13, 1999.

* cited by examiner

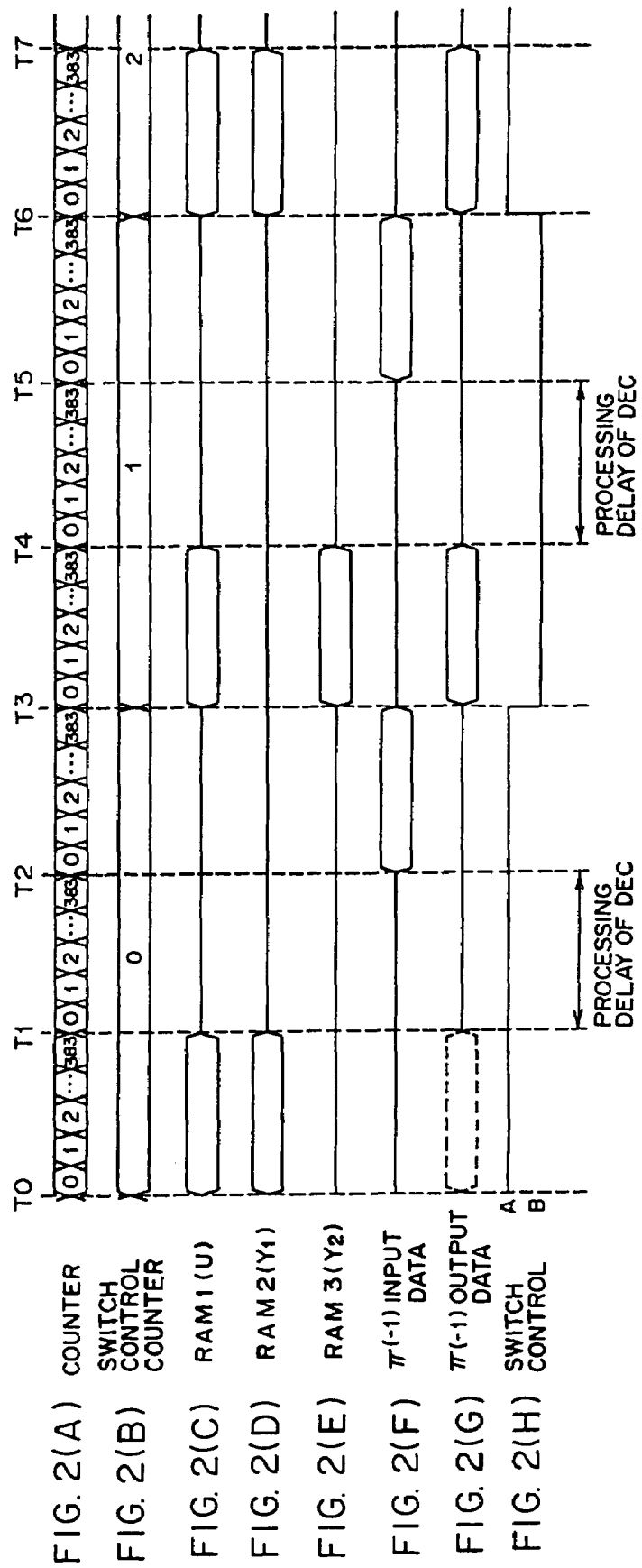

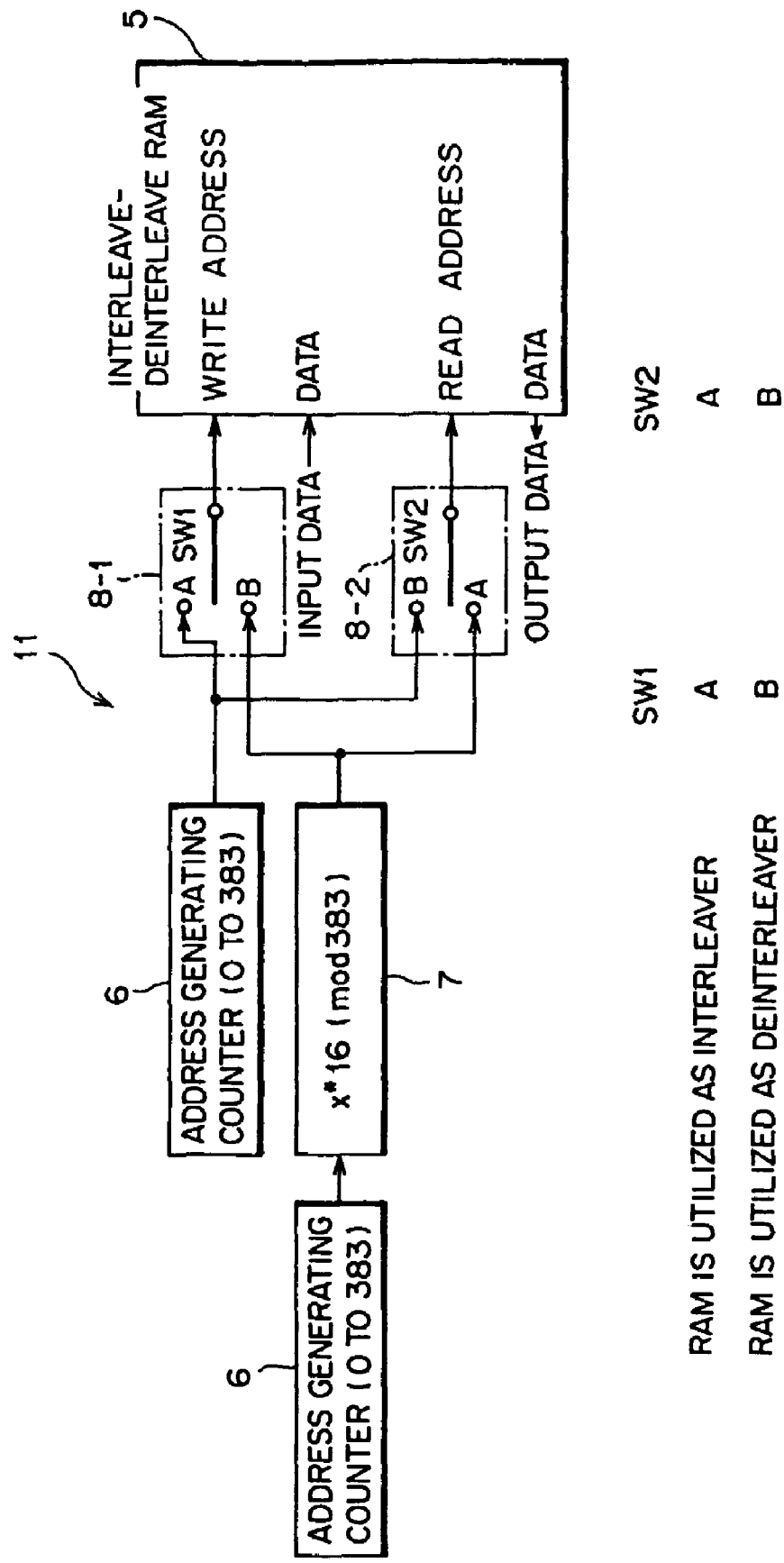

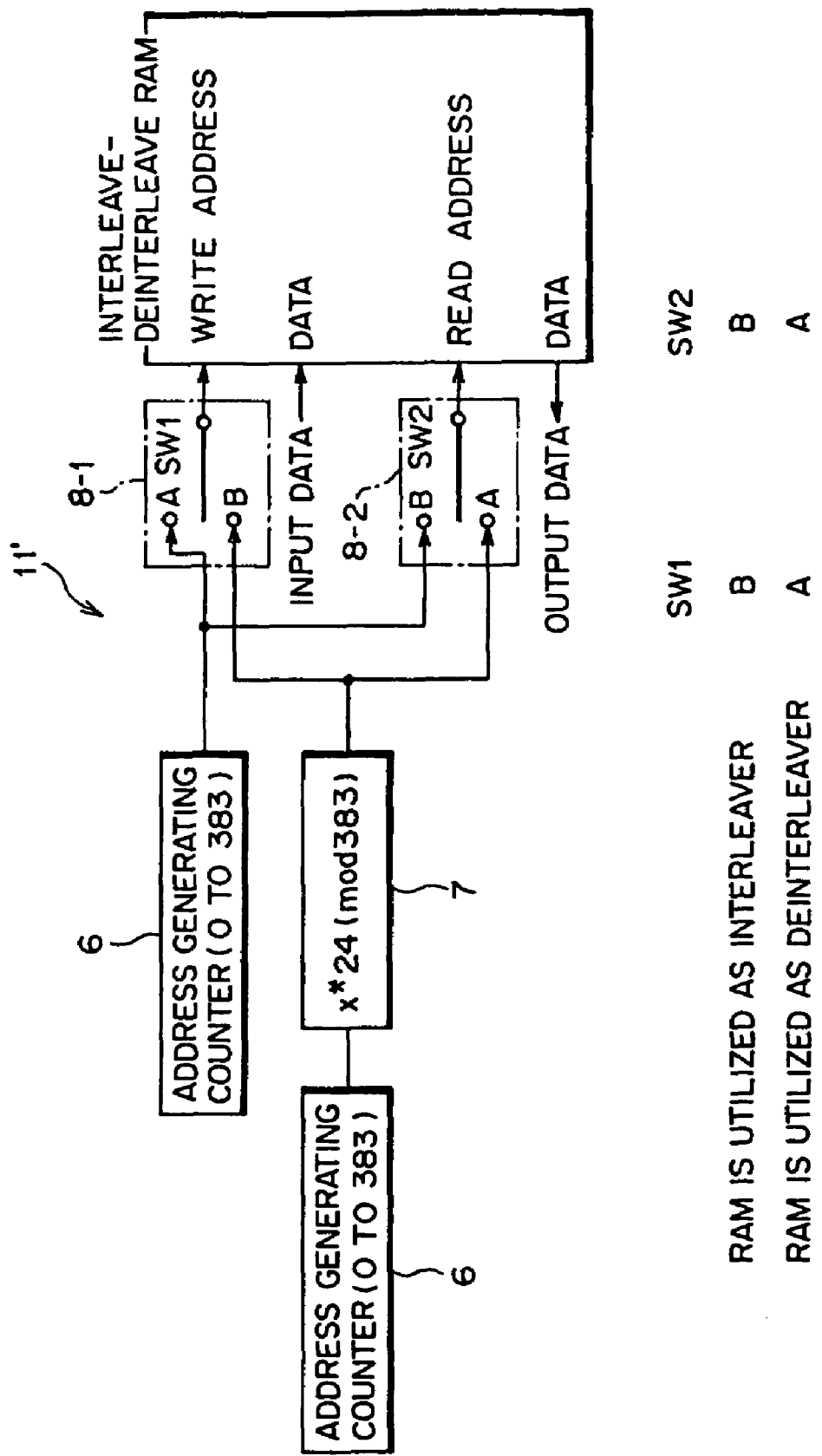

FIG. 7
PRIOR ART

DATA SERIES BEFORE INTERLEAVE OPERATION    000 001 002 003 004 005 006 007 008 • • • 380 381 382 383

⇓

A ─────────────────────────────────→ WRITING

B

```
000 001 002 003 004 005 006 007 008 009 010 011 012 013 014 015
016 017 018 019 020 021 022 023 024 025 026 027 028 029 030 031
032 033 034 035 036 037 038 039 040 041 042 043 044 045 046 047
048 049 050 051 052 053 054 055 056 057 058 059 060 061 062 063
064 065 066 067 068 069 070 071 072 073 074 075 076 077 078 079
080 081 082 083 084 085 086 087 088 089 090 091 092 093 094 095
096 097 098 099 100 101 102 103 104 105 106 107 108 109 110 111
112 113 114 115 116 117 118 119 120 121 122 123 124 125 126 127
128 129 130 131 132 133 134 135 136 137 138 139 140 141 142 143
144 145 146 147 148 149 150 151 152 153 154 155 156 157 158 159
160 161 162 163 164 165 166 167 168 169 170 171 172 173 174 175
176 177 178 179 180 181 182 183 184 185 186 187 188 189 190 191
192 193 194 195 196 197 198 199 200 201 202 203 204 205 206 207
208 209 210 211 212 213 214 215 216 217 218 219 220 221 222 223
224 225 226 227 228 229 230 231 232 233 234 235 236 237 238 239
240 241 242 243 244 245 246 247 248 249 250 251 252 253 254 255
256 257 258 259 260 261 262 263 264 265 266 267 268 269 270 271
272 273 274 275 276 277 278 279 280 281 282 283 284 285 286 287
288 289 290 291 292 293 294 295 296 297 298 299 300 301 302 303
304 305 306 307 308 309 310 311 312 313 314 315 316 317 318 319
320 321 322 323 324 325 326 327 328 329 330 331 332 333 334 335
336 337 338 339 340 341 342 343 344 345 346 347 348 349 350 351
352 353 354 355 356 357 358 359 360 361 362 363 364 365 366 367
368 369 370 371 372 373 374 375 376 377 378 379 380 381 382 383
```

READING

⇓

DATA SERIES AFTER INTERLEAVE OPERATION    000 016 032 048 064 080 096 112 128 • • • 351 367 383

FIG. 9
PRIOR ART

DATA SERIES BEFORE
INTERLEAVE          000 001 002 003 004 005 006 007 008 ···380 381 382 383
OPERATION

⇩

A ─────────────────────────────────────────────→ WRITING

B

```
000 001 002 003 004 005 006 007 008 009 010 011 012 013 014 ··· 023
024 025 026 027 028 029 030 031 032 033 034 035 036 037 038 ··· 047
048 049 050 051 052 053 054 055 056 057 058 059 060 061 062 ··· 071
072 073 074 075 076 077 078 079 080 081 082 083 084 085 086 ··· 095
096 097 098 099 100 101 102 103 104 105 106 107 108 109 110 ··· 119
120 121 122 123 124 125 126 127 128 129 130 131 132 133 134 ··· 143
144 145 146 147 148 149 150 151 152 153 154 155 156 157 158 ··· 167
168 169 170 171 172 173 174 175 176 177 178 179 180 181 182 ··· 191
192 193 194 195 196 197 198 199 200 201 202 203 204 205 206 ··· 215
216 217 218 219 220 221 222 223 224 225 226 227 228 229 230 ··· 239
240 241 242 243 244 245 246 247 248 249 250 251 252 253 254 ··· 263
264 265 266 267 268 269 270 271 272 273 274 275 276 277 278 ··· 287
288 289 290 291 292 293 294 295 296 297 298 299 300 301 302 ··· 311
312 313 314 315 316 317 318 319 320 321 322 323 324 325 326 ··· 335
336 337 338 339 340 341 342 343 344 345 346 347 348 349 350 ··· 359
360 361 362 363 364 365 366 367 368 369 370 371 372 373 374 ··· 383
```

READING

⇩

DATA SERIES AFTER
INTERLEAVE          000 024 048 072 096 120 144 168 192 ···311 335 359 383
OPERATION

TURBO DECODING APPARATUS AND INTERLEAVE-DEINTERLEAVE APPARATUS

CROSS-REFERENCE TO RELATED APPLICATION

This application is a continuation of U.S. application Ser. No. 10/352,515 filed on Jan. 28, 2003, now U.S. Pat. No. 6,993,699, which is a divisional of U.S. application Ser. No. 09/823,564, filed on Mar. 30, 2001, now U.S. Pat. No. 6,547, 766, which is a continuation of PCT/JP99/00934, filed on Feb. 26, 1999, the contents of which are hereby incorporated by reference.

TECHNICAL FIELD

The present invention relates to a turbo decoding apparatus and interleave-deinterleave apparatus suitable for use in, for example, a communication system such as a mobile communication system.

BACKGROUND ART

In a conventional wireless communication field including a mobile communication or the like, a device of interleaver and corresponding deinterleaver are introduced to sort the data series in order to make a burst error, which tends to occur frequently at a particular portion of the data series, corrected more easily. That is, a transmitting signal is transmitted after interleaved by an interleaver on the transmitting side, and received on the receiving side, and then the signal is deinterleaved by a deinterleaver.

A conventional interleaver and deinterleaver will hereinafter be described.

FIG. 6(A) is a block diagram showing an arrangement of a conventional interleaver. As shown in FIG. 6(A), an interleaver 100 comprises an interleave RAM 101, a writing counter 102, a reading counter 103 and a reading address converting circuit 104. The interleaver 100 shown in FIG. 6(A) is arranged based on an assumption that the interleaver interleaves an input data series composed of 24×16=384pieces of data (D000, D001, D002, . . . , D383) (i.e., the interleaver size=24×16).

In this case, the interleave RAM 101 (hereinafter denoted simply as "RAM 101") is a unit for storing therein the input data series (D000, D001, D002, . . . , D383) for interleave operation. The writing counter 102 is a unit for counting the numbers from 0 to 383 sequentially and outputs the counted value as a writing address (A000, A001, A002, . . . , A383) for the RAM 101. Thus, the input data series are sequentially written in the RAM 101 at addresses from A000 to A383 in accordance with the writing address (A000 to A383).

The reading counter 103 is a unit for counting a series of numbers from 0 to 383 for generating the reading address for the RAM 101. The reading address converting circuit 104 is a unit for effecting an arithmetic operation expressed by x*16 (mod383) on the counted number x (=0 to 383) supplied from the reading counter 103, thereby converting the series of counted numbers x generated from the reading counter 103 into one having a regular interval of 16. Thus, the series of reading addresses supplied to the RAM 101 becomes a series of addresses having a regular interval of 16 such that A000, A016, A032, . . . , A368, A001, A017, A033, . . . , An*16 (mod383), . . . , A351, A367, A383.

If the interleaver 100 is arranged as described above, as shown in FIG. 6(B), when data is written into the memory, the counted value of the writing counter 102 directly serves as the writing address and the input data series (D000, D001, D002, . . . , D383) are written at the corresponding address regions in the RAM 101 sequentially. On the other hand, when data are read from the memory, data are read from address regions designated by the reading address which are generated at the regular interval of 16 from the reading address converting circuit 104.

In this way, the input data series (D000, D001, D002, . . . , D383) are interleaved, and as a result outputted like D016, D032, . . . , D368, D001, D017, D033, . . . , Dn*16 (mod383), . . . , D351, D367, D383.

In other words, the interleave operation carried out in the present interleaver 100 can be illustrated as shown in FIG. 7, for example. That is, when data pieces of 24×16=384 are written into the RAM 101, the written data are arrayed in the direction indicated by an arrow A in this order while when the same data pieces are read from the memory, data pieces arrayed in the direction indicated by an arrow B are read in this order, whereby the interleave operation is accomplished (this manner of interleave operation is known as block interleave).

Meanwhile, FIG. 8(A) is a block diagram showing an arrangement of a conventional deinterleaver. As shown in FIG. 8(A), the deinterleaver 200 comprises a deinterleave RAM 201, a writing counter 202, a reading counter 203 and a reading address converting circuit 204. The deinterleaver 200 shown in FIG. 8(A) is arranged based on an assumption that the deinterleaver deals with an input data series composed of 16×24=384 pieces of data (D000, D001, D002, . . . ,D383).

This case, the deinterleave RAM 201 (hereinafter denoted simply as "RAM 201") is a unit for storing therein the input data series (D000, D001, D002, . . . , D383) for interleave operation. The writing counter 202 is a unit for counting the numbers from 0 to 383 sequentially and outputs the counted value as a writing address (A000, A001, A002, . . . , A383) for the RAM 201. Thus, the input data series are sequentially written in the RAM 201 at addresses from A000 to A383 in accordance with the writing address (A000 to A383).

The reading counter 203 is a unit for counting a series of numbers from 0 to 383 for generating the reading address for the RAM 201. The reading address converting circuit 204 is a unit for effecting an arithmetic operation expressed by x*24 (mod383) on the counted number x (=0 to 383) supplied from the reading counter 203, thereby converting the series of counted numbers x generated from the reading counter 203 comes to have a regular interval of 24. Thus, the series of reading addresses supplied to the RAM 201 becomes a series of addresses having a regular interval of 24 such that A000, A024, A048, . . . , A360, A001, A002, . . . , An*24(mod383), . . . , A335, A359, A383.

If the interleaver 200 is arranged as described above, as shown in FIG. 8(B), when data is written into the memory, the counted value of the writing counter 202 directly serves as the writing address and the input data series (D000, D001, D002, . . . , D383) are written in the RAM 201 at the corresponding address regions sequentially. On the other hand, when data are read from the memory, data are read from address regions designated by the reading address which are generated at the regular interval of 24 from the reading address converting circuit 204.

In this way, the input data series (D000, D001, D002, . . . , D383) are interleaved and as a result, outputted like D000, D024, D048, . . . , D360, D001, D025, . . . , Dn*24(mod383), . . . , D335, D359, D383. In other words, the operation of the present interleaver 200 is equivalent to an interleave operation at a size of 16×24. That is, as for example shown in FIG. 9, when data pieces of 16×24=384 are written into the RAM

201, the written data are arrayed in the direction indicated by an arrow A in this order while when the same data pieces are read from the memory, data pieces arrayed in the direction indicated by an arrow B are read in this order.

Accordingly, if the input data series are interleaved by 24×16 in the above-described interleaver 100, and the resulting output data series (D000, D016, D032, ..., D368, D001, D017, D033, ..., Dn*16(mod383), ..., D351, D367, D383) are supplied to the present deinterleaver 200, then writing and reading data series are carried out as shown in FIG. 8(C). That is, when writing is carried out, the output data series are written in the RAM 202 in the aforesaid order sequentially and when reading is carried out, data series are read at a regular interval of 24 addresses. As a result, the output data series are restored as one before the interleave operation (i.e., deinterleave operation is effected).

Meanwhile, recently, a new error correcting system known as "turbo encoding and turbo decoding" comes to be utilized. According to a communication system having the system of turbo encoding and turbo decoding applied thereto, transmitting information is encoded by an interleaver using a plurality of error correcting codes (recursive systematic convolutional code is often employed) on the transmitting side (in a turbo encoder). Then, on the receiving side (in a turbo decoder), the received information is subjected to an interleave operation, soft-output decoding, and deinterleave operation repeatedly by using an interleaver, a deinterleaver and a plurality of error correcting code (soft-output) decoders. Thus, errors attached to the transmitting information in the transmitting path are reduced as much as possible to restore the original transmitting information.

FIG. 10 is a block diagram showing an example of arrangement of a main portion of a communication system to which the aforesaid "turbo encoder and turbo decoder" is applied. As shown in FIG. 10, this communication system is arranged to include a turbo encoder 300 on the transmitting side while a turbo decoder (turbo decoding unit) 400 on the receiving side with a desired communication path (radio communication network and so on) 500 interposed therebetween. The turbo encoder 300 is composed of a pair of recursive systematic convolutional encoders (hereinafter simply referred to as "convolutional encoder") 301 and 302, each being arranged to include exclusive-OR logical sum elements (EX-OR) 311 to 313 and delay elements (flip-flop: FF) 314 and 315. The turbo encoder also includes an interleaver ($\pi$) 303 for effecting interleave operation on the transmitting information u. The turbo decoder 400 is arranged to include soft-output decoders (DEC) 401 and 402 and interleaver ($\pi$) 403 and deinterleaver ($\pi^{-1}$) 404.

The convolutional encoder 301 of the turbo encoder 300 is a unit for sending encoded information obtained by encoding the transmitting information u using convolution operation, to the receiving side as an error correcting code. $y_1$. The interleaver 303 is a unit for effecting interleave operation on the transmitting information u using the same operating principle as that of the aforesaid interleaver 100. The convolutional encoder 302 is a unit for sending the encoded information obtained by effecting convolutional encoding on the transmitting information u' which has been interleaved in the interleaver 303, to the receiving side as an error correcting code $y_2$.

That is, the turbo encoder 300 is arranged for sending the transmitting information (information to be decoded) u itself, the error correcting code $y_1$ about the transmitting information u before the interleave operation and the error correcting code $y_2$ about the transmitting information u after the interleave operation, to the receiving side as a turbo code.

On the other hand, the turbo decoder 400 repetitively carries out the following operations. That is, of the received turbo codes [in this case, it is assumed that the transmitting information u, the error correcting code $y_1$ and $y_2$ suffer from a noise (error) in the transmitting path 500 and they become received information U, error correcting codes $Y_1$ and $Y_2$, respectively], the DEC 401 receives the received information U and effects soft-output decoding thereon by using the error correcting code $Y_1$ so as to obtain received information U'. Thereafter, the interleaver 403 effects interleave operation of the received information U' and the DEC 402 effects soft-output decoding on the interleaved signal by using the error correcting code $Y_2$. Then, the decoded result (received information U") is deinterleaved in the deinterleaver 404 and obtained signal is fed back to the DEC 401. The DEC 401 again effects soft-output decoding by using error correcting code $Y_1$. The operations described above is repeated. When the soft-output decoding is effected, MAP (Maximum A Posteriori probability) decoding, SOVA (Soft-Output Viterbi Algorithm) decoding or the like is utilized.

The interleaver 403 also effects interleave operation on the decoded result supplied from the DEC 401 based on the similar operation principle to that the above interleaver 100. With this interleave operation, the data series as a decoding result from the DEC 401 are supplied to the DEC 402 with the data series matched with the data series of the error correcting code $Y_2$ utilized for soft-output decoding in the DEC 402.

Further, the DEC 402 is a unit for effecting soft-output decoding (e.g., MAP decoding, SOVA decoding or the like) on the decoded result having undergone the interleave operation by using the error correcting code $Y_2$. The deinterleaver 404 is a unit for effecting deinterleave operation on the decoded result supplied from the DEC 402 based on the similar operating principle to that of the aforesaid deinterleaver 200, thereby restoring the original data series. With this deinterleave operation, the data series as a result of decoding supplied from the DEC 402 are supplied to the DEC 401 with the data series matched with the data series of the error correcting code $Y_1$. Thus, the data series are again subjected to soft-output decoding by using the error correcting code $Y_1$ in the DEC 401.

As the following operation is repeated in the turbo decoder 400, errors attached to the transmitting information u tend to be removed from the information, and hence the original transmitting information u can be restored with higher degree of accuracy.

1. U undergoes soft-output decoding by using $Y_1$.→U'
2. U' undergoes soft-output decoding by using $Y_2$.→U"(output undergoing one-time turbo cycle repeat)
3. U" undergoes soft-output decoding by using $Y_1$.→U'³
4. U'³ undergoes soft-output decoding by using $Y_2$.→U'⁴ (output undergoing two-time turbo cycle repeat)
5. U'⁴ undergoes soft-output decoding by using $Y_1$.→U'⁵
4. U'⁵ undergoes soft-output decoding by using $Y_2$.→U'⁶ (output undergoing three-time turbo cycle repeat)
(the same operation may be similarly repeated)

The repeating time is set equal to or less than a saturating number (e.g., about 16 times).

In this way, the turbo decoder 400 repeats the operations of soft-output decoding, interleave and deinterleave by using the DECs 401 and 402, the interleaver 403 and the deinterleaver 404, whereby data encoded by the turbo coding system can be decoded. The turbo encoding and turbo decoding are described in detail in a reference such as U.S. Pat. No. 5,446, 747, for example.

According to the above-described turbo decoder 400, the operations of interleave and deinterleave are effected independently by the interleaver 403 and the deinterleaver 404. Therefore, the turbo decoder necessarily comes to have a very large-sized circuit.

In particular, in an actual communication situation, a single unit (in the above example of the data series, each of D000 to D383) of data series (data series as a target of interleave or deinterleave operation) as a decoding result comes to have several tens bits amount. If the single unit of the data series comes to have such a large size, the size of the interleaver (or deinterleaver) (i.e., memory size) will come to have several thousands bits amount, with the result that the above-identified problem will become more conspicuous.

Further, there is a chance that any arrangement other than the turbo decoder 400 will encounter the above-identified problem. That is, if a transmitter-receiver is arranged to communicate by using an interleaver and a corresponding deinterleaver, it is indispensable to prepare both of the interleaver 100 and the deinterleaver 200 independently if the transmitter-receiver is arranged based on the currently available technology. Therefore, the size of the apparatus will similarly become very large.

The present invention is made in view of the above aspect. Therefore, an object of the present invention is to provide a turbo decoding apparatus and an interleave-deinterleave apparatus which makes it possible to remarkably reduce the size of the apparatus.

DISCLOSURE OF THE INVENTION

In order to attain the above object, there is provided a turbo decoding apparatus of the present invention contains at least information to be decoded, an error correcting code for the information which is to be decoded and has not been interleaved on a transmitting side, and an error correcting code for the information which is to be decoded and has been interleaved on the transmitting side while an interleave operation and a deinterleave operation is repetitively carried out together with an error correcting code, characterized by including an error correction decoding unit capable of effecting error correction and decoding on the information to be decoded based on either one of the error correcting codes and a result of error correction and decoding which has been done in a preceding stage, a memory unit for effecting interleave operation and deinterleave operation on the result of error correction and decoding operation provided from the error correction decoding unit, and for outputting the data deriving from the error correction and decoding operation to the error correction decoding unit as a result of error correction and decoding operation which has been done in a preceding stage, and a memory control unit for controlling the order of writing/reading the result of error correction and decoding operation into/from the memory unit so that interleave operation and deinterleave operation can be effected on the result of error correction and decoding operation depending on the error correcting code utilized in the error correction decoding unit.

According to the turbo decoding apparatus of the present invention, by controlling the writing order and the reading order of the data in accordance with the error correcting code utilized in the error correction decoding unit, the data as the result of error correction decoding can be interleaved and deinterleaved. Therefore, it is unnecessary to provide an interleaver and a deinterleaver independently, thereby minimizing the size and cost of the turbo decoding apparatus.

The memory control unit may be arranged to include the following components:

(1) a first address generating unit for generating a series of addresses in a predetermined order for the memory unit;

(2) a second address generating unit for generating a series of addresses for the memory unit in an order which is different from that of the first address generating unit;

(3) a pair of address selecting units for selectively connecting one of outputs of the address generating units as a writing address of the memory unit while the other of the outputs of the address generating units as a reading address for the memory unit;

(4) an interleave mode determining unit for determining whether the error correcting code utilized in the error correction decoding unit is one arranged for the information which is to be decoded before interleave operation on the transmitting side or one arranged for the information which is to be decoded after interleave operation on the transmitting side; and (5) an address selection control unit for controlling the pair of address selecting units in such a manner that if the interleave determining unit determines that the error correcting code is one arranged for the information to be decoded before interleave operation, then one of the outputs of the address generating units is selected as the writing address while the other of outputs of the address generating units is selected as the reading address, and if the interleave determining unit determines that the error correcting code is one arranged for the information to be decoded after interleave operation, then the other of the outputs of the address generating units is selected as the writing address while that one of the outputs of the address generating units is selected as the reading address.

According to the above arrangement of the turbo decoding apparatus of the present invention, if the outputs from the first address generating unit and the second address generating unit are selectively controlled, the resulting data of the error correction decoding data can be satisfactorily controlled in the writing order and the reading order of the data on the memory unit depending on which the interleave or deinterleave is requested. Therefore, the present turbo decoding apparatus having extremely simple construction can be realized.

The second address generating unit may include a random pattern holding unit having random pattern information held therein for changing the sequence of addresses generated from the first address generating unit at random and outputting a series of addresses therefrom. If the second address generating unit is arranged as above, it becomes unnecessary to prepare two sets of random pattern information for interleave operation and deinterleave operation (i.e., the first address generating unit can be made to serve as not only a unit for interleave operation but also a unit for deinterleave operation). Therefore, cost for carrying out arithmetic operation requested upon determining the random pattern in advance can be remarkably reduced, and moreover the turbo decoding apparatus can be made smaller and constructed at an extremely low cost.

Further, according to the present invention, there is provided an interleaving-deinterleaving apparatus which includes a memory unit for storing therein data so that the data can be subjected to interleave and deinterleave operation, a first address generating unit for generating a series of addresses in a predetermined order for the memory unit, a second address generating unit for generating a series of addresses to the memory unit in an order which is different from that of the first address generating unit, a pair of address selecting units for selectively outputting one of outputs from the address generating units for a writing address of the memory unit while the other one of the outputs from the address generating units for a reading address for the memory unit, and an address selection control unit for controlling the pair of address selecting units in such a manner that the pair of address selecting units selects the outputs of the address generating units as the writing address and the reading address depending on the cases in which the data is requested to be interleaved or to be deinterleaved.

According to the above interleave-deinterleave apparatus of the present invention, one of outputs from the address generating units (two kinds of address data series differing from each other in its generating order) can be selected as the writing address or the reading address depending on whether the data is to be interleaved or to be interleaved. Therefore, the single memory unit can function as not only an interleaver but also as a deinterleaver. As a result, it becomes unnecessary to independently provide an interleaver and a deinterleaver for carrying out interleave operation and deinterleave operation, with the result that the apparatus can be made small and hence the apparatus can be constructed at an extremely low cost.

In this case, the address selection control unit may be arranged to control the pair of address selecting units in such a manner that if the data is to be interleaved, the output of the first address generating unit is selected as the writing address while the output of the second address generating unit is selected as the reading address, respectively, and if the data is to be deinterleaved, the output of the second address generating unit is selected as the writing address while the output of the first address generating unit is selected as the reading address, respectively.

Conversely, the address selection control unit may control the pair of address selecting units in such a manner that if the data is to be interleaved, the output of the second address generating unit is selected as the writing address while the output of the first address generating unit is selected as the reading address, respectively, and if the data is to be deinterleaved, the output of the first address generating unit is selected as the writing address while the output of the second address generating unit is selected as the reading address, respectively.

In both of the above cases, one of the interleaving function and the deinterleaving function can be selected by simply selecting one of the outputs from the address generating units. Therefore, the present apparatus can be constructed to have a very simple arrangement.

Also in the present interleave-deinterleave apparatus, the second address generating unit may include a random pattern holding unit for holding random pattern information which is used for rearranging the sequence of addresses, generated from the first address generating unit, at random and which is used for outputting the rearranged addresses. Also in this case, it becomes unnecessary to prepare two sets of random pattern information for interleave operation and deinterleave operation, (i.e., the first address generating unit can be made to serve as not only a unit for interleave operation but also a unit for deinterleave operation). Therefore, cost for carrying out arithmetic operation requested upon determining the random pattern in advance can be remarkably reduced, and moreover the present apparatus can be made smaller and constructed at an extremely low cost.

BRIEF DESCRIPTION OF THE DRAWINGS

FIGS. 2(A) to 2(H) are timing charts for explaining the operation of the turbo decoder as the embodiment;

FIG. 3 is a block diagram particularly showing an interleave-deinterleave unit employed in the turbo decoder as the embodiment;

FIG. 5 is a block diagram showing another arrangement of the interleave-deinterleave apparatus according to the present embodiment;

FIG. 7 is a diagram explaining the image on the operation of the interleaver shown in FIG. 6(A);

FIG. 9 is a diagram explaining the image on the operation of the interleaver shown in FIG. 8(A);

BEST MODE FOR CARRYING OUT THE PRESENT INVENTION

A mode for carrying out the present invention will hereinafter be described with reference to drawings.

Figure 1:
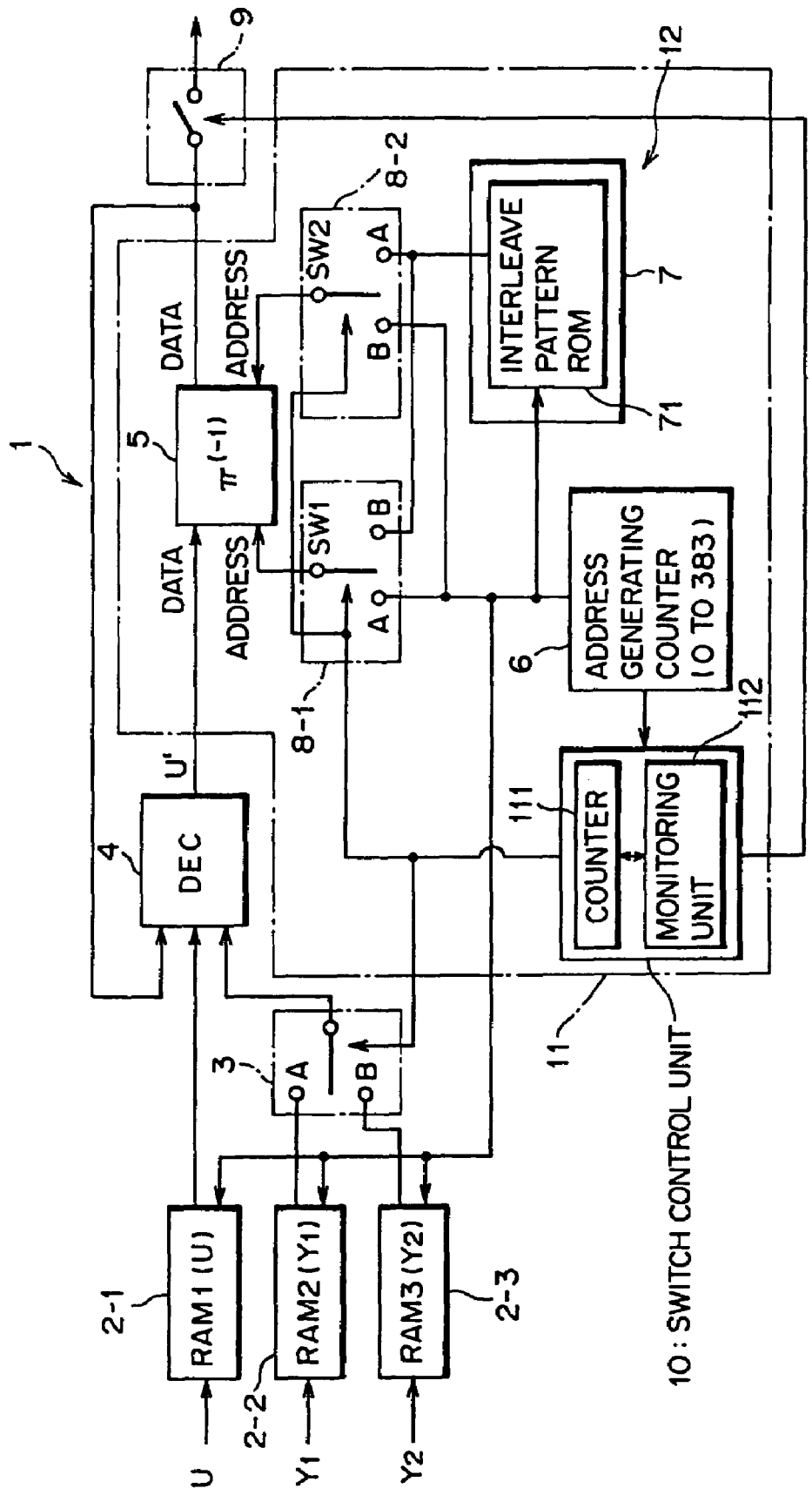
FIG. 1 is a block diagram showing an arrangement of a turbo decoder (turbo decoding apparatus) as one embodiment of the present invention.

FIG. 1 is a block diagram showing an arrangement of a turbo decoder (turbo decoding apparatus) as one embodiment of the present invention. As shown in FIG. 1, similarly to the aforesaid turbo decoder 400 described with reference to FIG. 10, the turbo decoder 1 is arranged to carry out decoding on a turbo code which has been encoded by the turbo encoder 300. According to the present embodiment, the turbo decoder 1 is arranged to include RAMs 2-1 to 2-3, a RAM selecting switch 3, a soft-output decoder (DEC) 4, an interleave/deinterleave RAM ($\pi^{(-1)}$) 5, an address generating counter 6, an address generating unit 7, a writing address selecting switch (SW1) 8-1, a reading address selecting switch (SW2) 8-2, an output selecting switch 9 and a switch control unit 10.

According to the assumption of the present embodiment, "turbo encoding system and turbo decoding system" is applied to a mobile communication system employing a CDMA (Code Division Multiple Access) system. For example, the turbo encoder 300 is provided on the transmitting side at a position where a transmitting information u is subjected to a primary modulation (e.g., QPSK or the like) and a position where the same information is subjected to a spread spectrum modulation. The turbo decoder 1 is provided on the receiving side at a position where received information U after the spread spectrum demodulation is inputted.

The above-described RAMs 2-1 and 2-3 are units for storing therein turbo codes [received information (information to be decoded) U, error correcting codes $Y_1$, $Y_2$] which have suffered from error in the transmitting path 500 upon transmission from the turbo encoder 300. According to the present embodiment, the received information U and error correcting codes $Y_1$, $Y_2$ are controlled in writing in and reading from the RAMs in accordance with the counts generated by the address generating counter 6.

According to the present embodiment, for the sake of convenience of explanation, similarly to the aforesaid conventional example described with reference to FIGS. 6(A), 6(B), 7, 8(A) to 8(C) and 9, it is assumed that each of the data series of the received information U, error correcting codes $Y_1$, $Y_2$ and resulting decoded data of the soft-output from the DEC 4 are composed of 16×24=384 (D000 to D383) data pieces. For this reason, the count generated from the address generating counter 6 ranges from 0 to 383. Thus, as will be described later on, turbo decoding is carried out at the period of data series unit (cycle).

Also in the present embodiment, the above error correcting code $Y_1$ is obtained in such a manner that the transmitting information u is encoded in a convolutional encoding in the turbo encoder 300 before the transmitting information u undergoes interleave operation in the interleaver 303 (that is, the error correcting code $Y_1$ serves as one effecting on the transmitting information u in the turbo encoder 300 before interleave operation). Conversely, the error correcting code $Y_2$ is obtained in such a manner that the transmitting information u is encoded in a convolutional encoding in the turbo encoder 300 after the transmitting information u undergoes interleave operation in the interleaver 303 (that is, the error correcting code $Y_2$ serves as one effecting on the transmitting information u in the turbo encoder 300 after interleave operation).

The RAM selecting switch 3 is a unit for selectively switching an output from the RAM 2-2 (i.e., the error correcting code $Y_1$) and an output from the RAM 2-3 (i.e., the error correcting code $Y_2$) from each of the RAMs 2-1 to 2-3. According to the present embodiment, the output terminal of the RAM selecting switch 3 is alternately connected to one of the A-side terminal and the B-side terminal under the control of the switch control unit 10.

The DEC (error correction decoding unit) 4 is arranged similarly to the DEC 401 or the DEC 402 which were described with reference to FIG. 10. In this case, the error correction decoding unit 4 effects soft-output decoding (error correction decoding: e.g., MAP decoding) on the received information U based on either of the error correcting codes $Y_1$ or $Y_2$) and data deriving from the soft-output decoding having effected in a preceding step U' (except for the first received information) which are supplied through the terminal selected by the RAM selecting switch 3. That is, according to the turbo decoder 1 of the present embodiment, the RAM selecting switch 3 is provided so that the DECs 401 and 402, which are provided in the conventional turbo decoder 400, are replaced with a single unit of error correction decoding unit 4.

The interleave-deinterleave RAM (memory unit) 5 is a unit for storing therein data resulting from the soft-output decoding (hereinafter simply referred to as "decoded result") supplied from the DEC 4 so that the supplied data can be interleaved and deinterleaved. The decoded result after the interleave operation or the deinterleave operation is fed back to the DEC 4 as the above-mentioned past decoded result U'.

The address generating counter (first address generating unit) 6 is a unit for sequentially counting a series of numbers from 0 to 383 so that the count thereof is supplied to the interleave-deinterleave RAM 5 (hereinafter referred to as RAM 5) as a series of addresses (A000 to A383). The address converting unit (second address generating unit) 7 is a unit for generating a series of address for the RAM 5 in an order which is different from the order in which the addresses are generated from the address generating counter 6. In this example, the order of the series of addresses generated from the address generating counter 6 (A000 to A383) are rearranged to form with an interval of 16 counts (A000, A016, A032, . . . An*16(mod383), . . . , A351, A367, A383) and the series of addresses are supplied to the RAM 5 as addresses.

For this reason, the address converting unit 7 is arranged to include an interleave pattern ROM (address generating pattern holding unit) 71 (hereinafter simply referred to as "ROM 71") which has information stored therein interleave pattern information for address generating order conversion [concretely, for example, if x is taken as a count of the address generating counter 6, corresponding address is made to be x*16(mod383), or random pattern information (i.e., address converting table)]. Of course, ROM 71 can be transposed to reading address converting circuit 104.

The writing address selecting switch 8-1 selects one of the output (address) from the address generating counter 6 and the output (address) of the address converting unit 7, whereby either of the address series is selected as a writing address series for the RAM 5. In this example, as shown in FIG. 1, if the switch 8-1 connects its output terminal to the A-side terminal, the output from the address generating counter 6 is selected as the writing address for the RAM 5 while if the switch 8-1 connects its output terminal to the B-side terminal, the output from the address converting unit 7 is selected as the writing address for the RAM 5.

Conversely, the reading address selecting switch 8-2 selects one of the output (address) from the address generating counter 6 and the output (address) of the address converting unit 7, whereby either of the address series is selected as a reading address series. As for example shown in FIG. 1, if the switch 8-2 connects its output terminal to the A-side terminal, the output from the address converting unit 7 is selected as the reading address for the RAM 5 while if the switch 8-2 connects its output terminal to the B-side terminal, the output from the address generating counter 6 is selected as the reading address.

In this example, the switches 8-1 and 8-2 are arranged to change their connection to the A-side or B-side simultaneously under the control of the switch control unit 10 (i.e., control is made to prohibit the state that the switch 8-1 connects the A-side terminal and the switch 8-2 connects the B-side terminal or the state that the switch 8-1 connects the B-side terminal and the switch 8-2 connects the A-side terminal at a time). That is, the switches 8-1 and 8-2 are arranged to function as an address selecting unit such that one of the outputs from the address generating counter 6 and the address converting counter 7 is supplied to the RAM 5 as a writing address and the other of the same is supplied to the RAM 5 as a reading address.

The output selecting switch 9 is turned to ON state when the decoded result is outputted after the turbo decoding is completed. For example, if the repeating time of the decoding operation in the DEC 4 reaches a saturation time, with the result that error correction function is no longer advantageously effected, the output selecting switch 9 is brought to ON state under control of the switch control unit 10.

Figure 10:
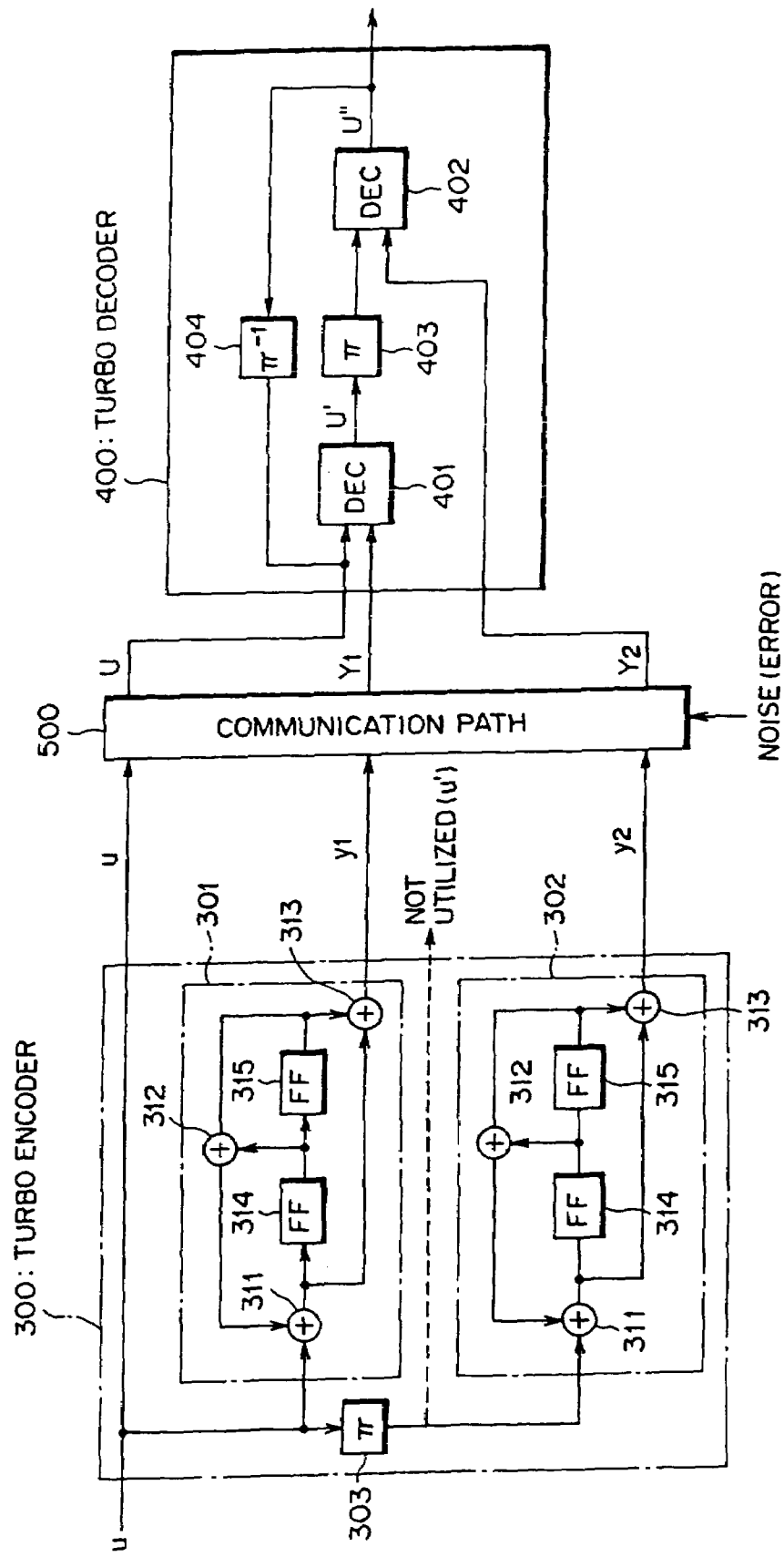
FIG. 10 is a block diagram showing an example of arrangement of the main portion of a communication system to which a conventional arrangement including a turbo coding system and a turbo decoding system is applied.

According to the present embodiment, the above saturation time becomes about 16 (the saturation time in the arrangement shown in FIG. 10)×2=32 if the MAP decoding is applied to the DEC 4, because two time repeat of decoding in the DEC 4 is equivalent to one time decoding in the DEC 401 and the DEC 402 shown in FIG. 10.

The switch control unit 10 is a unit for controlling the whole switching operation effected in the respective switches 3, 8-1, 8-2 and 9. The switch control unit 10 controls the respective switches 3, 8-1, 8-2 as main switching units of the present embodiment in the following manner.

(1) When the switch 3 connects its output terminal to the A-side terminal (i.e., the error correcting code $Y_1$ is utilized in decoding in the DEC 4), then the switches 8-1 and 8-2 also connect their output terminals to the A-side terminals, respectively. If the switches are placed in this connection status, the connection arrangement of the RAM 5, the address generating counter 6 and the address converting counter 7 becomes equivalent to that of the interleaver 100 shown in FIG. 6(A). As a result, the decoding result (D000 to D383) supplied from the DEC 4 is written in the RAM 5 in accordance with the address series (A000 to A383) generated from the address generating counter 6, and thereafter the same are read from the RAM 5 in accordance with the address series having a regular interval of 16 addresses generated from the address converting unit 7. In this way, the interleave operation is effected.

(2) When the switch 3 connects its output terminal to the B-side terminal (i.e., the error correcting code $Y_2$ is utilized in decoding in the DEC 4), then the switches 8-1 and 8-2 also connect their output terminals to the B-side terminals, respectively. If the switches are placed in this connection status, the connection arrangement of the RAM 5, the address generating counter 6 and the address converting counter 7 becomes equivalent to that shown in FIG. 4(A). As a result, the decoding result supplied from the DEC 4 is written in the RAM 5 in accordance with the address series having a regular interval of 16 addresses generated from the address converting unit 7, and thereafter the same are read from the RAM 5 in accordance with the address series (A000 to A383) generated from the address generating counter 6.

Figure 4A:
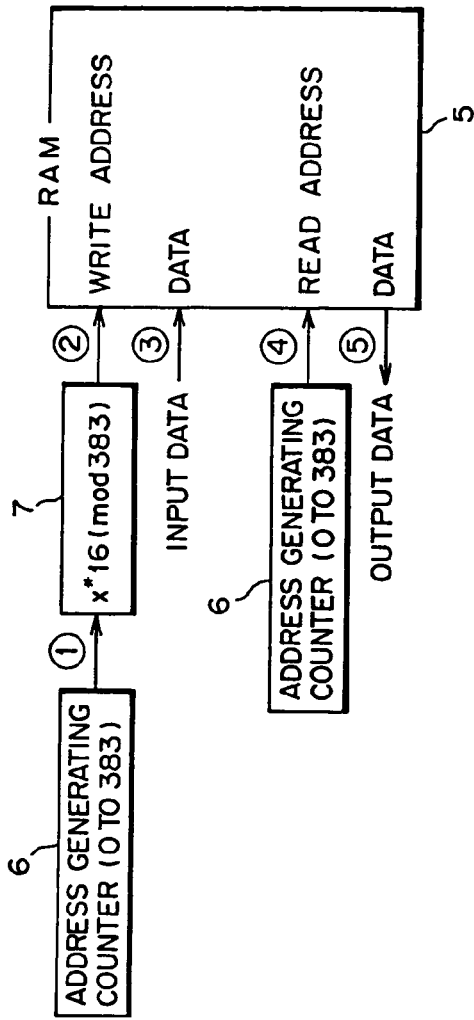
FIG. 4(A) is a block diagram showing an arrangement of a deinterleaver according to the present embodiment.
Figure 4B:
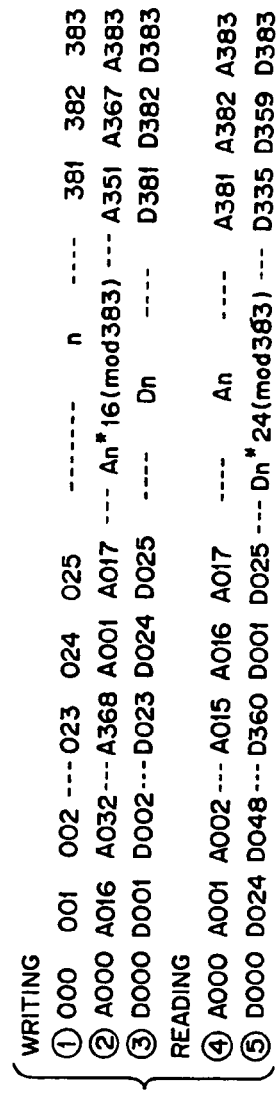
FIGS. 4(B) and 4(C) are diagrams showing a series of address output and series of input/output data for explaining the operation of the deinterleaver shown in FIG. 4(A)
Figure 4C:
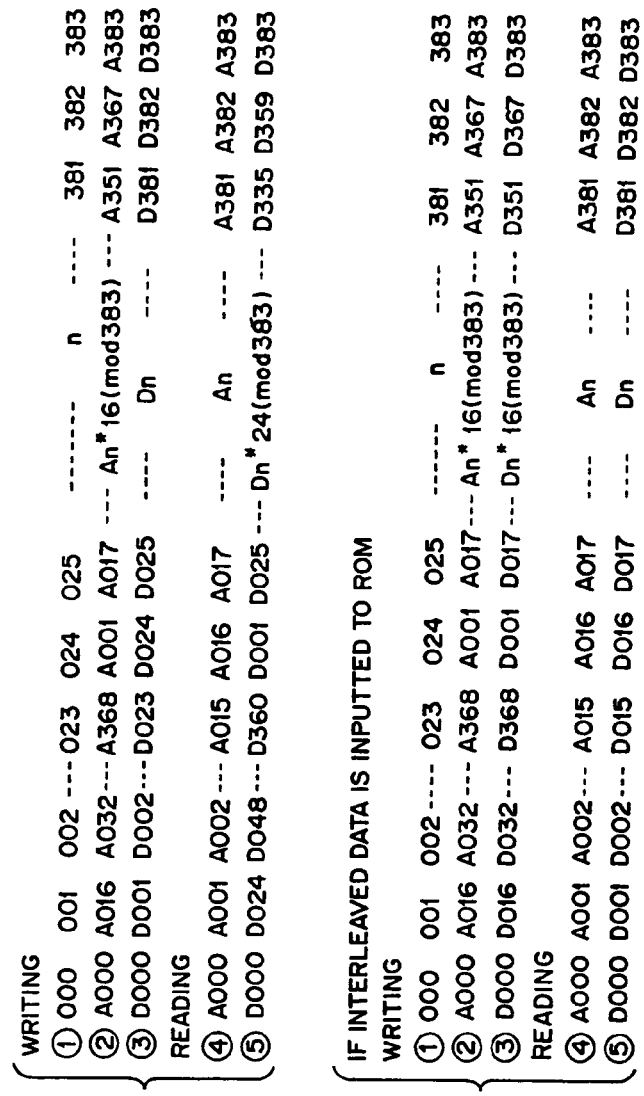
Figures 6A, 6B:
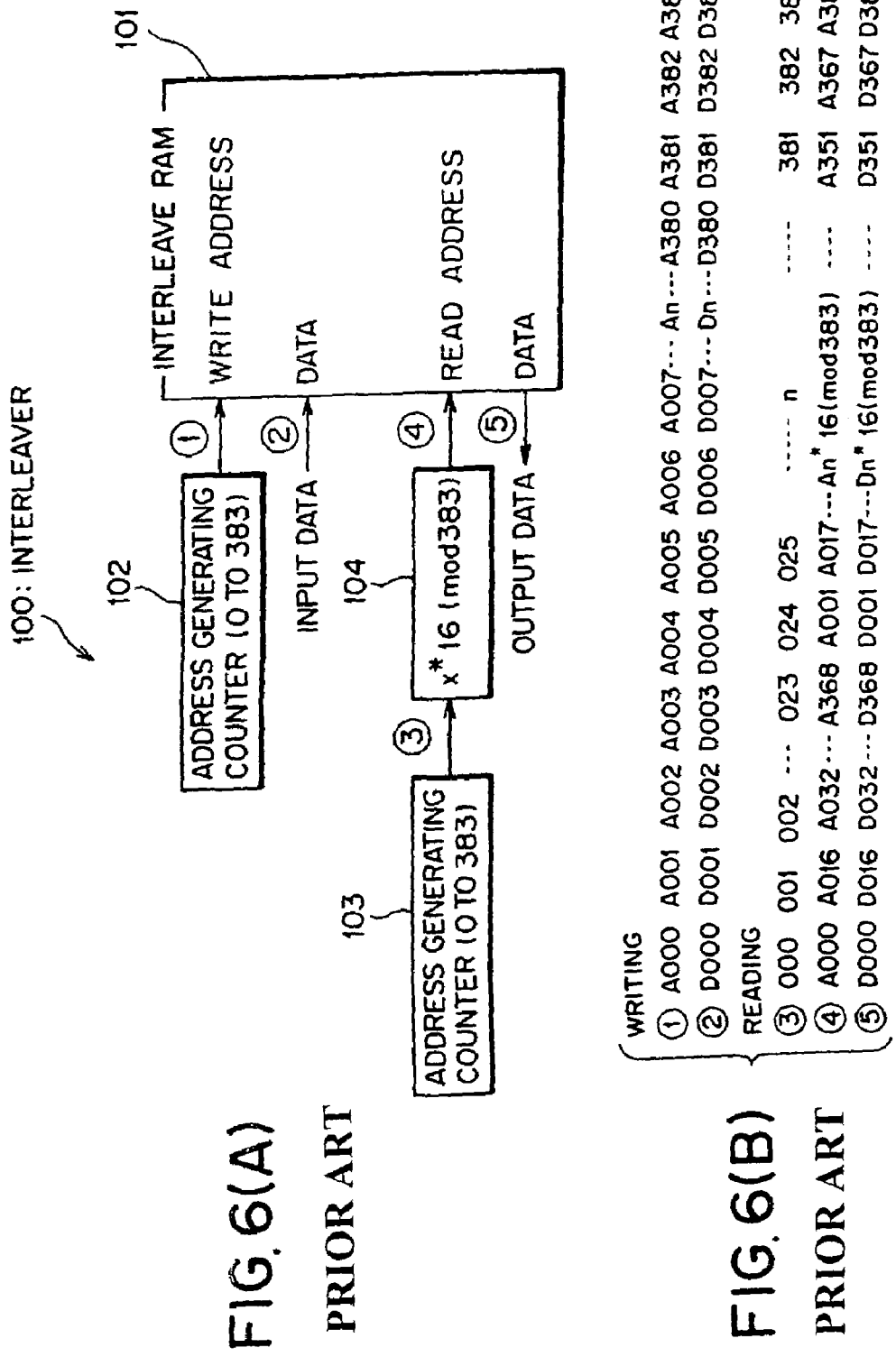
FIG. 6(A) is a block diagram showing an arrangement of a conventional interleaver.
FIG. 6(B) is a diagram showing a series of address output and series of input/output data for explaining the operation of the interleaver shown in FIG. 6(A)
Figure 8A:
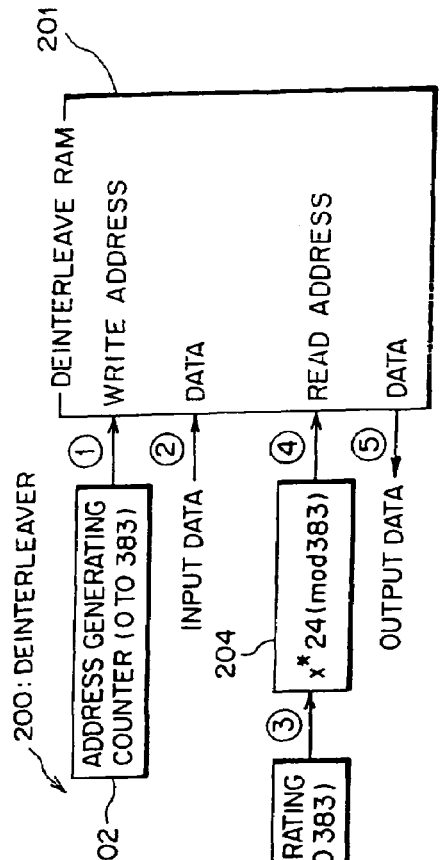
FIG. 8(A) is a block diagram showing an arrangement of a conventional deinterleaver.
Figure 8B:
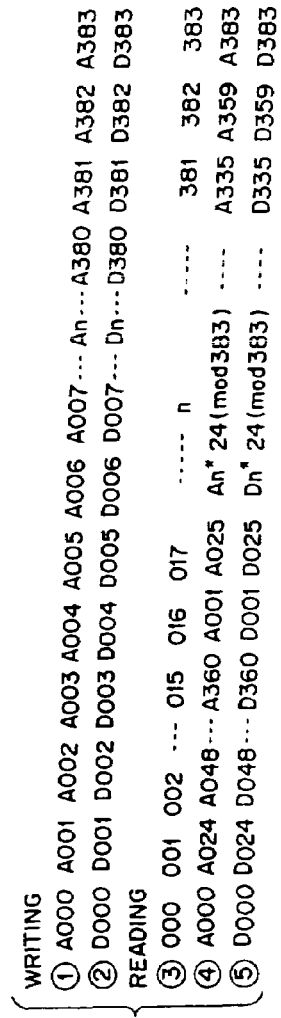
FIGS. 8(B) and 8(C) are diagrams showing a series of address output and series of input/output data for explaining the operation of the deinterleaver shown in FIG. 8(A)
Figure 8C:
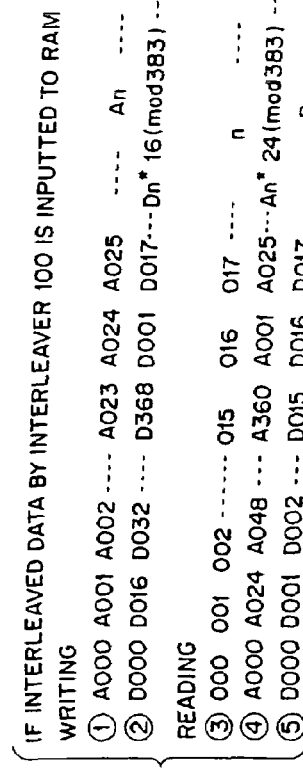

Accordingly, if the input data series has an order from D000 to D383, the data series are written and read in the order shown in FIG. 4(B). However, if the input data series after the interleave operation are arranged as shown in FIG. 4(A), then the writing and the reading are carried out in the order shown in FIG. 4(C), with the result that the output data series from the RAM 5 restores the order before the above interleave operation is effected (i.e., deinterleave operation is effected).

That is, according to the turbo decoder of the present embodiment, if the switching control unit 10 controls the switching operation of the switches 8-1 and 8-2, the portion composed of the RAM 5, the address generating counter 6 and the address converting unit 7 can function as an interleaver or a deinterleaver (i.e., the turbo decoder includes the interleave-deinterleave apparatus 11 as for example shown in FIG. 3).

In order to carry out the above switching control, the switching control unit 10 comprises a switch control counter 111 and a count monitoring unit 112, for example.

In this case, the switch control counter 111 is a unit for counting the count for switching control based on the count value of the address generating counter 6. According to the arrangement of the present embodiment, by taking delay deriving from the decoding processing in the DEC 4 account, for example, if the counting period (from 0 to 383) of the address generating counter 6 is regarded as a unit period, the switch control counter 111 incrementally counts one by one from zero at every three periods.

The count monitoring unit 112 is a unit for monitoring the count value of the counter 111. In this case, for example, the count monitoring unit 112 determines whether the count is odd number or even number, and if it is determined the count is an even number (including zero), the switches 3, 8-1, and 8-2 are switched to A-side terminals while if it is determined the count is an odd number, the switches 3, 8-1, and 8-2 are switched to B-side terminals.

If the count of the counter 111 reaches, for example, 31 (that is, the repeating time of decoding operation effected in the DEC 4 reaches 32, or the saturation time), the count monitoring unit 112 determines that the turbo decoding has been completed. Then, the count monitoring unit 112 changes the output selecting switch 9 to the ON status.

Now, operation of the turbo decoder 1 of the present embodiment arranged as described above will hereinafter be described with reference to timing charts of FIGS. 2(A) to 2(H).

Initially, when the first decoding step is started, the switch control unit 10 makes the RAM selecting switch 3 select the A-side terminal so that the received information U undergoes the soft-output decoding by using the error correcting code $Y_1$ (the switch 9 is in the OFF state). Thus, in accordance with the count of the address generating counter 6 [see FIG. 2(A)], the received information U and the error correcting code $Y_1$ are sequentially read from the RAM 2-1 and 2-2 [see timing points T0 to T1 in FIGS. 2(A) and 2(B)], and supplied to the DEC 4.

The DEC 4 effects the soft-output decoding on the received information U based on the supplied error correcting code $Y_1$ (timing point T1 to T2). At this time, since the count monitoring unit 112 determines that the count of the counter 111 is zero (even number), the switch control unit 10 makes the switches 8-1 and 8-2 select the respective A-side terminals [see FIG. 2(H)].

In this way, the decoding result of the DEC 4 is written in the RAM 5 in accordance with the sequence address generated from the address generating counter 6 [see timing point T2 to T3 in FIG. 2(F)]. Thereafter, the written data are read in accordance with the series of address having a regular interval of 16 addresses supplied from the address converting unit 7 [see timing point T3 to T4 in FIG. 2(G)]. Thus, interleave operation is accomplished.

The processing of decoding has been carried out so far, the count of the counter 111 becomes 1 (odd number) [see timing point in FIG. 2(A)]. Therefore, the switch control unit 10 makes the switches 3, 8-1 and 8-2 to be switched to the B-side terminal in turn.

In response to the changing of the terminals of the switches, the decoding result after the interleave operation (past decoding result U'), the received information U, and the error correcting code $Y_2$ is inputted to the DEC 4. The DEC 4 effects second time soft-output decoding based on the supplied information (timing point T4 to T5). At this time, the received information U is again inputted to the DEC 4. This is because difference between the past decoding result U' and the received information U is taken and the following decoding processing is effected based on the difference and the error correcting codes $Y_1$ and $Y_2$. Accordingly, if the DEC 4 is provided with a memory for storing therein the received information U, the received information U need not to be inputted to the DEC 4 every time.

The decoding result of the DEC 4 is inputted to the RAM 5. At this time, since the switches 8-1 and 8-2 are switched to the B-side terminal [see timing point T5 in FIG. 2(H)], the decoding result is written into the RAM 5 in accordance with the series of addresses having the regular interval of 16 supplied from the address converting unit 7 [see timing point T5 to T6 in FIG. 2(F)]. Thereafter, the decoding result are read in accordance with the address series having an incrementing order generated from the address generating counter 6 [see timing point T6 to T7 in FIG. 2(G)]. In this way, the deinterleave operation is accomplished.

The switches 3, 8-1 and 8-2 are alternately switched each time the decoding operation is repeated, i.e., repeated three times, four times and so on in a similar manner. If the count of the counter 111 reaches, for example, 31 (i.e., $32^{nd}$ decoding step is completed), the switch 9 is controlled to be in ON state and the recording result is allowed to be generated therefrom.

That is, the address generating counter 6, the address converting unit 7, the switches 8-1, 8-2 and the switch control unit 10 are collectively arranged to function as a memory control unit 12 in which the decoding results are controlled in writing in the RAM 5 or reading from the same so that the interleave operation and deinterleave operation are effected in accordance with the error correcting codes $Y_1$ and $Y_2$ utilized in the DEC 4.

For this reason, the count monitoring unit 112 functions as an interleave determining unit for determining whether the error correcting code utilized in the DEC 4 is of the transmitted information u before the interleave operation in the turbo encoder 300 ($Y_1$) or of the transmitted information u after the interleave operation in the turbo encoder 300 ($Y_2$)

The switch control unit 10 is arranged to function as an address selection control unit for controlling the switches 8-1 and 8-2 in such a manner that if the count monitoring unit 112 determines that the error correcting code utilized in the DEC 4 is the error correcting code $Y_1$, the output from the address generating counter 6 is selected as the writing address while the output from the address converting unit 7 is selected as the reading address, and if the count monitoring unit 112 determines that the error correcting code utilized in the DEC 4 is the error correcting code $Y_2$, the output from the address converting unit 7 is selected as the writing address while the output from the address generating counter 6 is selected as the reading address.

That is, in the interleave-deinterleave apparatus 11 (see FIG. 3), the switch control unit 10 controls the switches 8-1 and 8-2 so that the outputs from the address generating units 6 and 7 are selected as the writing address and reading address in a different manner depending on cases where data (decoding result) are to be interleaved or to be deinterleaved.

As described above, according to the turbo decoder 1 of the present embodiment, the switch control unit 10 controls the switches 8-1 and 8-2 depending on the error correcting codes $Y_1$ and $Y_2$ utilized in the DEC 4, whereby the decoding result deriving from the DEC 4 can be controlled in writing order into the RAM 5 and the reading order from the same. Therefore, the decoding result can selectively undergo the interleave operation or the deinterleave operation in response to the switching control. Accordingly, it becomes unnecessary for the turbo decoder 1 to have an interleaver and a deinterleaver independently.

Therefore, the turbo decoder 1 can be implemented with about half the size of circuit compared with a conventional decoder, with the result that the turbo decoder 1 can be remarkably small-sized and implemented at remarkably small cost. In particular, since the turbo decoder of the present embodiment is arranged to include the RAM selecting switch 3, operation of the conventional turbo decoder 400 can be realized by the single unit of DEC 4. Therefore, the size and cost of the arrangement thereof can be further reduced.

As described above, the present embodiment has a simple arrangement. That is, the switch control unit 10 controls the switches 8-1 and 8-2 so that the outputs (addresses) from the address generating units 6 and 7 are selected as the writing address and the reading address for the RAM 5 depending on whether the decoding result is to be interleaved or deinterleaved. Therefore, the interleave operation and the deinterleave operation can be effected in the single unit of the RAM 5. Accordingly, the turbo decoder 1 can be controlled with ease. Moreover, it becomes possible to expect great contribution in small-sizing of the turbo decoder 1.

Further, according to the present embodiment, if the address converting unit 7 is provided with a ROM 71 having stored therein random pattern information which is utilized for changing the order of the output (series of addresses) generated from the address generating unit 6 (in the above case, the series of addresses are changed into a series having a regular interval of 16 addresses), it becomes unnecessary to prepare two kinds of random pattern information for interleave operation and deinterleave operation (i.e., the address generating counter 6 can serve as a counter for interleave operation and deinterleave operation).

Therefore, the turbo decoder 1 can be remarkably relieved from a burden which is requested when random pattern information is created in advance by carrying out arithmetic operation. Moreover, the turbo decoder 1 can be further small-sized and made at smaller cost.

In particular, (though in the above example, the random pattern is not a simple rule such that the series of addresses are made to be changed into a series having a regular interval of 16 addresses) interleave (deinterleave) operation, actually effected in the turbo coding-decoding system, is a complicated interleave (deinterleave) operation known as "random interleave (deinterleave)", it is extremely advantageous that only one kind of random pattern information is sufficient to prepare for effecting the interleave or deinterleave operation.

Also in the above embodiment, the error correcting codes $Y_1$ and $Y_2$ utilized in the DEC 4 is made to start alternate switching from the status of the error correcting code $Y_1$ (i.e., the switch 3 is made to start alternate switching from the A-side connection status), the alternate switching may be started from the status of the error correcting code $Y_2$ (i.e., the switch 3 is made to start alternate switching from the B-side connection status). If the switching is controlled as described above, the same effect will be obtained.

In this case, however, contrary to the above example, the switch control unit 10 shall be arranged to start the alternate interleave-deinterleave operation to be effected on the decoding result from the DEC 4 from the status of deinterleave operation. Therefore, the switches 8-1 and 8-2 shall start the switching from the B-side connection status.

Further, according to the interleave-deinterleave apparatus 11 of the present embodiment, when data (decoding result) is read (i.e., the switches 8-1 and 8-2 are switched to A-side), the rearrangement of the data series (interleave) using the random pattern information stored in the address converting unit 7 is effected, and when the data is written (i.e., the switches 8-1 and 8-2 are switched to B-side), the rearrangement of the data series (deinterleave) using the same random pattern information is effected. However, the relationship between the switch connection status and which operation of the interleave or the deinterleave is effected may be inversely settled.

That is, as shown in FIG. 5 for example, if the above random pattern of x*16(mod383) stored in the ROM 71 is replaced with another random pattern of x*24mod(383), the following operation will be expected. That is, when the switches 8-1 and 8-2 are switched to B-side, data will be written in accordance with an address series having a regular interval of 24 addresses generated from the address converting unit 7, and the data will be read from the memory in accordance with the incremental address series generated from the address generating counter 6. Therefore, the interleave-deinterleave apparatus 11' shown in FIG. 5 serves as an interleaver which effects interleave operation upon writing data.

Conversely, if the switches 8-1 and 8-2 are switched to A-side, data will be written in accordance with the incremental address series generated from the address generating counter 6, and the data will be read from the memory in accordance with an address series having a regular interval of 24 addresses generated from the address converting unit 7. In this way, the interleave-deinterleave apparatus 11' serves as a deinterleaver which effects deinterleave operation upon reading the data.

Accordingly, if the ROM 71 is made to have the random pattern of x*24mod(383) stored therein (i.e., the interleave-deinterleave apparatus 11' shown in FIG. 5 is applied to the turbo decoder), the switch control unit 10 shall be arranged to control the switches 8-1 and 8-2 in the following manner. That is, when the data (decoding result) is to be interleaved (the switch 3 is switched to A-side), the switches 8-1 and 8-2 are switched to B-side so that the output from the address converting unit 7 is selected as a writing address while the output from the address generating counter 6 is selected as a reading address. Further, when the data is to be deinterleaved (the switch 3 is switched to B-side), the switches 8-1 and 8-2 are switched to A-side so that the output from the address generating counter 6 is selected as a writing address while the output from the address converting unit 7 is selected as a reading address.

Also in this case, it is needless to say that effects or advantages similar to those of the aforesaid embodiment will be obtained.

OTHERS

While in the above embodiment description has been made on a case in which the interleave-deinterleave apparatus 11 (or 11') is applied to the turbo decoder 1, it is needless to say that application of the interleave-deinterleave apparatus 11 (11') is not limited to the turbo decoder 1. That is, the interleave-deinterleave apparatus can be applied to any system in which both of interleave operation and corresponding deinterleave operation are requested to be executed. Also in this case, the system, to which the interleave-deinterleave apparatus is applied, can be implemented at an extremely small size.

Also, in the above embodiment, description has been made on a case in which the number of data pieces composing the input data series to be interleaved and deinterleaved is set to 384 (D000 to D383) for convenience of explanation, and the random pattern information utilized upon the interleave and deinterleave operation is of x*16(mod383) [or alternatively, x*24(mod383)], the present invention is not limited to these conditions. Namely, even if the input data series may be composed of different number of data pieces than that of the above case, the same effects or advantages can be obtained.

Although the arrangement of the present embodiment, as shown in FIG. 1, is merely one example. Therefore, any arrangement can be taken so long as the arrangement can implement at least the operations illustrated in the timing charts shown in FIGS. 2(A) to 2(H).

While in the above embodiment, description has been made on a case in which the present invention is applied to a mobile communication system utilizing a CDMA system, the present invention is not limited thereto but can applied to systems such as a multiple access radio communication system using other systems, e.g., FDMA (Frequency Division Multiple Access), TDMA (Time Division Multiple Access) or other desired communication system and so on. Furthermore, also in other fields, it is applicable. For example, it is applicable to the magnetic disk used for memory maintenance, etc. Also in these applications, the effects or advantages similar to those of the above embodiment will be obtained The present invention is not limited to the above-described embodiments but various modifications can be effected without departing from the gist of the present invention.

INDUSTRIAL APPLICABILITY

As described above, according to the present invention, since a single memory unit can function as an interleaver and a deinterleaver, a mobile communication system needs not to be provided with an interleaver and deinterleaver independently. Therefore, a communication equipment, in which interleave operation and deinterleave operation are requested to carry out, can be remarkably made small and made at smaller cost. Thus, it is expected that the utility of the present invention is extremely high.

What is claimed is:

1. An interleave-deinterleave apparatus comprising:
   an interleave/deinterleave memory unit that performs both interleave and deinterleave operations during turbo decoding;
   a pair of address selecting units, one selecting unit selectively connecting outputs of an address generating unit as a writing address of said interleave/deinterleave memory unit and another selecting unit connecting outputs of an address generating unit as a reading address for said interleave/deinterleave memory unit; and
   an address selection control unit for controlling the pair of address selecting units to effect operation of the interleave/deinterleave memory unit as an interleaver and a deinterleaver in a time divisional manner.

2. The interleave-deinterleave apparatus according to claim 1, wherein said interleave-deinterleave apparatus is a part of a turbo decoder.

3. The interleave-deinterleave apparatus according to claim 1, wherein said interleave-deinterleave apparatus is used in the following systems: CDMA, FDMA, or TDMA.

* * * * *